United States Patent [19]

Tong et al.

[11] Patent Number: 4,509,207
[45] Date of Patent: Apr. 2, 1985

[54] UHF RF AMPLIFIER AND AGC SYSTEM

[75] Inventors: Francis F. Tong, Chicago; Harmon P. Vaughter, Evanston, both of Ill.

[73] Assignee: Zenith Electronics Corporation, Glenview, Ill.

[21] Appl. No.: 511,803

[22] Filed: Jul. 7, 1983

[51] Int. Cl.³ ............................................. H04B 1/26
[52] U.S. Cl. .................................. 455/251; 455/189; 455/200; 455/253
[58] Field of Search ............... 455/200, 234, 249, 250, 455/251, 253, 188–190

[56] References Cited

U.S. PATENT DOCUMENTS 3,038,072  6/1962  Proudfit .............................. 455/253
4,380,828  4/1983  Moon ................................. 455/319

*Primary Examiner*—Marc E. Bookbinder

[57] ABSTRACT

A UHF tuning system for providing linear high gain operation over the entire UHF band comprises a field effect transistor (FET) amplifier coupling a received RF signal to a mixer for developing an IF signal, the IF signal being coupled to an IF processing stage by a signal regulating diode. An AGC control signal is derived from the IF stage for controlling the gain of the FET amplifier which, in turn, is utilized to control the conduction of the regulating diode so as to provide a substantially constant level IF signal to the IF processing stage. The novel arrangement of the present invention permits the field effect transistor to operate at a lower voltage for more efficient thermal operation and increased reliability while providing a high, flat gain characteristic over the entire UHF band.

6 Claims, 2 Drawing Figures

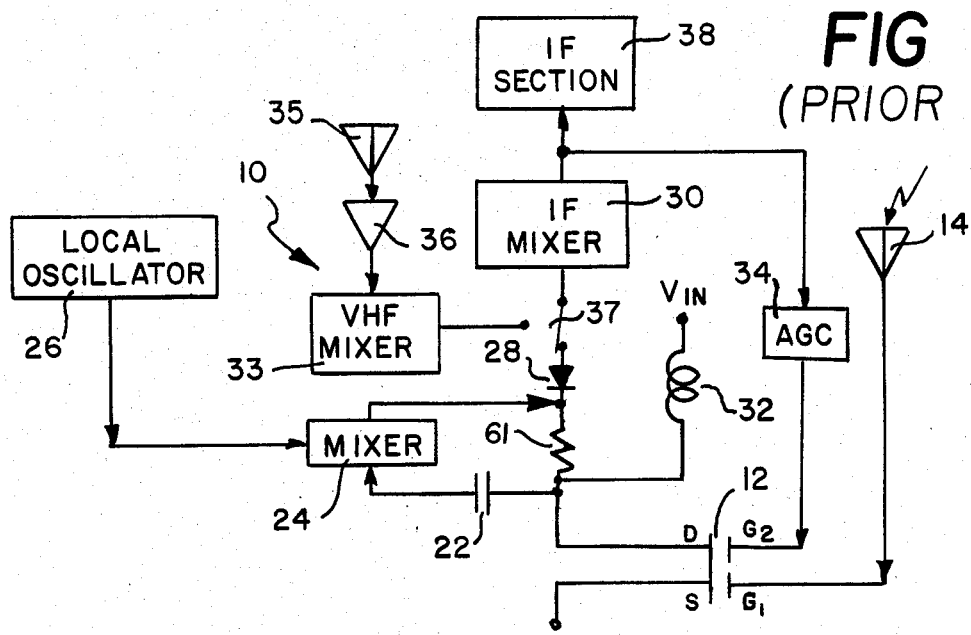
FIG 1 *(PRIOR ART)*
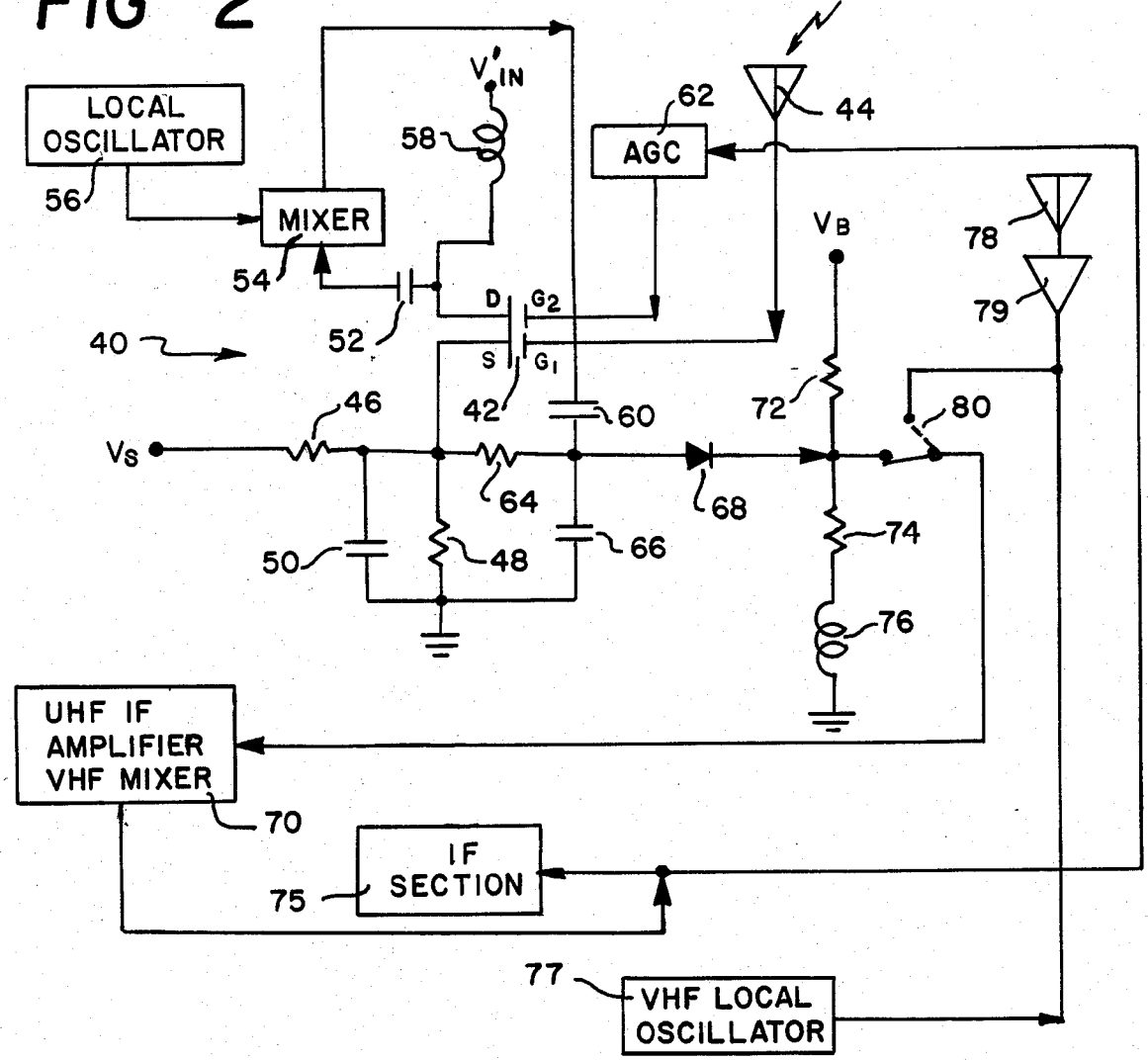
FIG 2

UHF RF AMPLIFIER AND AGC SYSTEM

BACKGROUND OF THE INVENTION

This invention relates in general to RF receivers and is particularly directed to an RF amplifier and IF automatic gain control (AGC) system for a UHF receiver.

A conventional television receiver includes a radio frequency (RF) section and an intermediate frequency (IF) section. The RF section includes RF filters which are turned to coarsely filter a band of frequencies centered about a selected channel. The output of the RF filter is provided to the input of an RF amplifier which typically has a gain of at least 20 to 30 db. The output of the RF amplifier couples to one input of a mixer, while a second input of the mixer receives mixing signals of a selectable frequency from a local oscillator in generating a heterodyned lower, intermediate frequency (IF) of approximately 45 MHz. The output of the mixer is filtered and amplified for processing in an IF section for tuning to a selected channel.

Tuning over the UHF band from 470 MHz (channel 14) to 890 MHz (channel 83) presents special difficulties because of this large frequency range. Prior art UHF tuners have suffered from limitations in signal handling capability over such a large bandwidth. Some of the shortcomings have been overcome by the use of metal-oxide-semiconductor (MOS) field-effect transistors (FET's) in the front end and tuning stages of the television receiver. MOSFET's offer a high input impedance of from $10^9$ to $10^{15}$ ohms for improved impedance matching with the antenna and RF filters in the front end of the receiver. In addition, the gain-bandwidth figure of a MOSFET can easily be made greater than 100 MHz. A further advantage in many applications is the thermal stability of MOSFET's and the lack of thermal runaway. In contrast to bipolar transistors, their current decreases with increasing temperature.

Because of the various inherent advantages in MOSFET operation, they are finding increased use in the front end of RF receivers. For example, U.S. Pat. No. 4,380,828 to Moon discloses a UHF television receiver tuner which includes a MOSFET mixer stage. MOSFET's have also been used in the received signal amplification stage in a television receiver as shown in FIG. 1.

FIG. 1 shows the use of a MOSFET 12 in the front end of a UHF receiver 10. The received signal is provided to the G1 gate of MOSFET 12 via antenna 14. The resistance of the current path from the MOSFET's source (S) to drain (D) electrodes is modulated by the voltage applied to the G2 gate of MOSFET 12. A $V_S$ biasing voltage is applied to the source electrode of MOSFET 12 via a voltage dividing network (not shown). The amplified output of MOSFET 12 is provided from the drain to mixer circuit 24 via AC coupling capacitor 22. Also provided to mixer circuit 24 is a reference frequency output from local oscillator 26 for generating a 45 MHz IF signal which is provided via blocking diode 28 and two-position U/V switch 37 to an IF amplifier 30 and thence to an IF section 38. Provision is also made for providing a VHF IF signal via U/V switch 37 and VHF RF amplifier and mixer stages 36, 33 to IF amplifier 30 when it is desired to tune to a VHF signal received by VHF antenna 35. A choke 32 is coupled between the cathode of diode 28 and the drain of MOSFET 12 and is connected to a $V_{IN}$ voltage source which drives the MOSFET 12. Choke 32 isolates the AC signal in the UHF receiver front end 10 from the $V_{IN}$ supply. Resistor 61 isolates the cathode of blocking diode 28 from $V_{IN}$ and from the output of MOSFET 12. The output of the IF amplifier 30 is provided to an automatic gain control (AGC) system 34 which, in turn, provides a MOSFET control input to the G2 gate thereof. Thus, the amplitude of the IF signal provided from the receiver front end to the IF section 38 is controlled in a feedback arrangement by means of the voltage applied to the G2 electrode of MOSFET 12 from AGC system 34.

Ideally, the AGC-controlled input to the control gate of MOSFET 12 ensures a relatively constant output from the IF amplifier to the IF section. However, because of variations in the signal processing characteristics of the UHF receiver front end primarily due to the wide frequency range of the UHF band, variations in IF signal amplitude are encountered. These variations in IF signal level may cause the video amplifiers to become overloaded in the case of a strong incoming signal, resulting in cross modulation and clipping of the synchronizing components of the received video signal. On the other hand, a weak incoming signal may cause the output of the various video amplifiers to be too low to provide proper picture reproduction. Variation in IF signal level is caused not only by variations in operating characteristics of the UHF receiver front end, but also by limitations in the operation of the AGC circuit.

The present invention is intended to overcome the limitations of the prior art by providing a UHF RF amplifier/IF AGC system having constant gain over the entire UHF bandwidth which provides isolation between the RF and IF signals for reduced cross-modulation and intermodulation interference. In addition, the present invention is capable of operating at reduced voltage levels for improved thermal operation and increased reliability.

OBJECTS OF THE INVENTION

Accordingly, it is an object of the present invention to provide linear received signal gain over the UHF band.

It is another object of the present invention to provide an RF amplifier arrangement in a television receiver which is capable of providing automatic gain control of an IF signal therein.

It is yet another object of the present invention to provide increased isolation between the RF and IF sections of a UHF receiver.

A further object of the present invention is to provide an RF amplifier for the front end of a UHF receiver including a field effect transistor capable of operating at reduced voltage levels.

BRIEF DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings in which:

FIG. 1 shows in block diagram form and schematic diagram form a prior art UHF receiver front end utilizing a MOSFET RF amplifier; and FIG. 2, which is partially in block diagram form and partially in schematic form, shows a UHF RF amplifier- /IF AGC system in accordance with a preferred embodiment of the present invention.

DESCRIPTION OF THE PREFERRED EMBODIMENT

Referring to FIG. 2, there is shown a UHF RF amplifier/IF AGC system 40 in accordance with a preferred embodiment of the present invention.

A received UHF signal is provided via UHF antenna 44 to the G1 gate of MOSFET 42. The source (S) of MOSFET 42 is biased by means of a $V_S$ voltage source and the combination of resistors 46, 48 and grounded capacitor 50. Resistors 46, 48 and capacitor 50 divide down and filter the $V_S$ biasing voltage provided to the source of MOSFET 42. The resistance of the current path from the source to the drain (D) electrodes of MOSFET 42 is modulated by the voltage applied to the G2 gate of the transistor from an AGC system 62 in a feedback arrangement described below.

The amplified output of MOSFET 42 is provided from its drain electrode to a UHF mixer circuit 54 via AC coupling capacitor 52. Capacitor 52 passes the AC component of the AGC-corrected received and amplified RF signal while blocking DC components thereof. The drain electrode of MOSFET 42 is biased by means of a $V'_{IN}$ voltage source coupled to the drain electrode via inductor 58. Inductor 58 isolates the AC component of the amplified output of MOSFET 42 from the $V'_{IN}$ voltage source.

The other input to UHF mixer circuit 54 is a reference frequency signal from local oscillator 56. The received RF signal and the reference frequency signal are heterodyned within mixer circuit 54 in a conventional manner to produce an IF signal of approximately 45 MHz. This IF signal is provided via coupling capacitor 60 to the anode of diode 68. With diode 68 forward biased, the IF signal is then provided via two position U/V switch 80 to a UHF IF amplifier/VHF circuit 70. From the UHF IF amplifier/VHF mixer circuit 70 the amplified signal is then provided to an IF section 75 for processing therein.

Also coupled via U/V switch 80 to the UHF IF amplifier/VHF mixer circuit 70 is the serial combination of a VHF receiving antenna 78 and RF amplifier 79. A VHF signal received by antenna 78 is provided to VHF RF amplifier 79 for amplification therein. The amplified RF output from amplifier 79 is then provided via U/V switch 80, when in the proper position, to UHF IF amplifier/VHF mixer circuit 70. When in the VHF mode of operation as determined by the selected position of U/V switch 80, a received VHF signal is mixed within the UHF IF amplifier/VHF mixer circuit 70 with a VHF reference frequency signal from a VHF local oscillator 77. The output of UHF IF amplifier/VHF mixer circuit 70 when U/V switch 80 is in the VHF mode of operation is also an IF output signal which is provided to the IF section 75 for processing therein. Thus, viewer selection of the position of U/V switch 80 determines whether a UHF or VHF received signal will be processed within IF section 75 for display and viewing. Circuit 70 thus performs the function of a UHF IF amplifier when U/V switch 80 is in the UHF mode of operation and the function of a VHF mixer when U/V switch 80 is in the VHF mode of operation.

As indicated above, when diode 68 is forward biased a UHF IF signal will be provided to U/V switch 80. Capacitor 60 AC couples mixer circuit 54 with the anode of diode 68 and blocks any DC component of the IF signal. Proper diode biasing is provided by a $V_B$ source which is divided down by the combination of resistors 72, 74. Grounded capacitor 66 and grounded inductor 76 are selected to provide proper impedance matching between the UHF mixer circuit 54 and UHF IF amplifier/VHF mixer circuit 70 and the IF section 75.

Resistor 64, coupled between the anode of diode 68 and the source biasing/voltage divider network comprised of resistors 46, 48 and grounded capacitor 50, serves to isolate the amplified IF output of mixer 54 from the AC signal ground established by capacitor 50. The isolation thus provided reduces undesired intermodulation and cross modulation products in the UHF RF amplifier/IF AGC system 40. In addition, resistor 64 provides a path whereby increases or decreases in the strength of the received UHF signal provide a biasing input to diode 68 for controlling its level of conduction and thus serving to control the signal level of the UHF IF signal provided to the UHF IF amplifier/VHF mixer circuit 70. For example, an increase in the received UHF signal level will result in a feedback signal being provided from AGC system 62 to the G2 gate of MOSFET 42 reducing the voltage at the G2 gate. A reduction in the voltage at the G2 gate will cause a corresponding reduction in the voltage applied across the source and drain electrodes of MOSFET 42 and the resulting current flowing therebetween. A reduction in the current flowing through MOSFET 42 will be reflected in a reduced level RF signal being coupled to mixer 54 in accordance with normal AGC operation. However, in addition to the normal AGC operation of the circuit, the reduced MOSFET current will also be reflected in a reduced voltage across resistor 64 and a resulting reduction in the biasing voltage applied across diode 68. Thus, diode 68 will be rendered less conductive in response to an increase in signal amplitude of the received RF signal provided to MOSFET 42 resulting in a reduction in signal amplitude of the IF signal provided to the UHF IF amplifier/VHF mixer circuit 70 via switch 80. Thus, MOSFET 42 is used not only to amplify the received UHF RF signal in accordance with the AGC gain control signal, but also, in combination with diode 68, to control the UHF IF signal level.

In a preferred embodiment $V_S$, $V'_{IN}$, and $V_B$ are .2 VDC. The G2 gate and the G1 gate of MOSFET 42 are respectively maintained at 8 and 4 VDC. Similarly, the source of MOSFET 42 is maintained at approximately 4 VDC, while the drain thereof is maintained at 12 VDC. Finally, the following table indicates the preferred values of the various components utilized in a preferred embodiment of the present invention.

| Reference No. | Preferred Value |
|---|---|
| 46 | 2 Kilohm |
| 48 | 20 Ohms |
| 50 | 10 Picofarads |
| 52 | 7 Picofarads |
| 60 | 5 Picofarads |
| 64 | 1 Kilohm |
| 66 | 5 Picofarads |
| 72 | 5 Kilohms |
| 74 | 2 Kilohms |

There has thus been shown a UHF RF amplifier/IF AGC system for use in the front end of a UHF receiver for amplifying the received RF signal and, in combination with an AGC feedback signal, for providing improved control of the UHF IF signal level in providing a flat frequency and amplitude response over the entire UHF band. In addition, the present invention provides improved isolation between RF and IF signals for reduced cross-modulation and intermodulation interference.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a UHF tuning system including a local oscillator for generating a reference frequency signal and a mixer coupled thereto for mixing said reference frequency signal with a received RF signal to generate an IF signal for processing in an IF stage coupled to said mixer, said UHF tuning system further including RF AGC means responsive to the amplitude of said IF signal for generating a correction signal for controlling the amplitude of said received RF signal coupled to the mixer, a UHF RF amplifier/IF AGC system comprising:

a field effect transistor amplifier coupled to said mixer and responsive to said received RF signal for providing an amplified RF signal to said mixer, the gain of said field effect transistor being controlled in response to said correction signal for regulating the amplitude of the amplified RF signal coupled to the mixer;

biasing means coupled to said field effect transistor amplifier for establishing the operating point thereof and for providing a variable control signal responsive to a variable condition at an output of said field effect transistor amplifier; and a circuit coupled between said mixer and said IF stage and coupled to said biasing means and being responsive to said contral signal for regulating the amplitude of said IF signal coupled from said mixer to said IF stage.

2. A UHF RF amplifier/IF AGC system as in claim 1 further including a UHF antenna for receiving said RF signal, said field effect transistor amplifier including a first gate electrode coupled to said antenna for receiving said RF signal, a second gate electrode coupled to said RF AGC means, a drain electrode coupled to said mixer for providing said amplified RF signal thereto, and a source electrode coupled to said biasing means, the control signal being determined by the impedance established between said drain and source electrodes in response to said correction signal.

3. A UHF RF amplifier/IF AGC system as in claim 2 wherein said circuit comprises unidirectional conducting means for linearly regulating the amplitude of said IF signal in response to the control signal.

4. A UHF RF amplifier/IF AGC system as in claim 3 including resistor means coupled to said source electrode and said unidirectional conducting means for controlling the conduction of said unidirectional conducting means as a function of said control signal and for isolating said IF signal from said biasing means.

5. A UHF RF amplifier/IF AGC system as in claim 1 further including the combination of a VHF antenna and amplifier for receiving and amplifying a VHF signal, said UHF RF amplifier/IF AGC system further including UHF IF amplifier/VHF mixer means coupled to said circuit and to said VHF amplifier by means of a two position switch and further coupled to said IF stage for providing an IF signal thereto, wherein with said switch in a first position said UHF IF amplifier/VHF mixer means operates as a UHF IF amplifier and with said switch in a second position said UHF IF amplifier/VHF mixer means operates as a VHF mixer.

6. In a UHF tuning system including a local oscillator for generating a reference frequency signal and a mixer coupled thereto for mixing said reference frequency signal with a received RF signal to generate an IF signal for processing in an IF stage coupled to said mixer, said UHF tuning system further including RF AGC means responsive to the amplitude of said IF signal for generating a correction signal for controlling the amplitude of said received RF signal coupled to the mixer, a UHF RF amplifier/IF AGC system comprising:

a UHF antenna for receiving said RF signal;

a field effect transistor amplifier including a first gate electrode coupled to said UHF antenna for receiving said RF signal, a second gate electrode coupled to said RF AGC means, a drain electrode coupled to said mixer for providing an amplified RF signal thereto, and a source electrode, wherein the gain of said field effect transistor is controlled by said correction signal for regulating the amplitude of the amplified RF signal provided to said mixer;

biasing means coupled to the source electrode of said field effect transistor amplifier for establishing the operating point thereof and for providing a variable control signal responsive to a variable condition at said source electrode;

unidirectional conducting means coupled between said mixer and said IF stage for providing said IF signal thereto; and a resistor coupled to a point between said biasing means and the source electrode of said field effect transistor and further coupled to said unidirectional conducting means wherein the conduction of said unidirectional conducting means is controlled by said control signal for regulating the amplitude of said IF signal and for isolating said IF signal from said biasing means.

* * * * *